United States Patent
Aragüez Del Corral

(10) Patent No.: US 10,693,283 B2
(45) Date of Patent: Jun. 23, 2020

(54) UNDERGROUND MODULAR TRANSFORMATION CENTRE THAT IS RESISTANT TO DISASTERS AND ADVERSE CONDITIONS

(71) Applicant: Inés Aragüez Del Corral, Velez-Málaga (ES)

(72) Inventor: Inés Aragüez Del Corral, Velez-Málaga (ES)

(*) Notice: Subject to any disclaimer, the term of this patent is extended or adjusted under 35 U.S.C. 154(b) by 0 days.

(21) Appl. No.: 15/998,624

(22) PCT Filed: Jan. 16, 2017

(86) PCT No.: PCT/ES2017/000003
§ 371 (c)(1),
(2) Date: Aug. 15, 2018

(87) PCT Pub. No.: WO2017/140924
PCT Pub. Date: Aug. 24, 2017

(65) Prior Publication Data
US 2019/0356117 A1    Nov. 21, 2019

(30) Foreign Application Priority Data
Feb. 15, 2016 (ES) .................. 201600114 U

(51) Int. Cl.
*H02B 7/08* (2006.01)
*H02B 1/56* (2006.01)
(Continued)

(52) U.S. Cl.
CPC ............... *H02B 7/08* (2013.01); *H02B 1/20* (2013.01); *H02B 1/28* (2013.01); *H02B 1/56* (2013.01);
(Continued)

(58) Field of Classification Search
CPC ... H02B 7/08; H02B 1/20; H02B 1/28; H02B 1/56; H05K 7/20309; H05K 7/20318; H05K 7/20327; H05K 7/20936
(Continued)

(56) References Cited

U.S. PATENT DOCUMENTS 1,891,959 A * 12/1932 Sprong .................... H02B 7/08
361/268
1,986,619 A * 1/1935 Blake ....................... H02B 7/08
361/603
(Continued)

FOREIGN PATENT DOCUMENTS

CH          427952 A     1/1967
CN       204424739 U     6/2015
(Continued)

OTHER PUBLICATIONS

Extended European Search Report of the European Patent Office for Application No. EP17752718.1 issued by the European Patent Office, dated Feb. 2, 2019, 10 pages, Munich, Germany.
(Continued)

*Primary Examiner* — Anatoly Vortman
(74) *Attorney, Agent, or Firm* — Peter B. Scull; HDC IP Law LLP

(57) ABSTRACT

An underground modular transformation centre that is resistant to disasters and adverse conditions, having a transformer without fins. The tank has electrical connection outlets in the lower lateral zones. This tank is also provided with piping in which holes are drilled, positioned in diametrically opposing points inside the tank, and threading on the external part thereof protruding from the tank. Also provided are threaded casings on the lateral panel of the tank in order to accommodate temperature detectors.

13 Claims, 11 Drawing Sheets

(51) Int. Cl.
*H02B 1/28* (2006.01)
*H02B 1/20* (2006.01)
*H05K 7/20* (2006.01)

(52) U.S. Cl.
CPC ..... *H05K 7/20309* (2013.01); *H05K 7/20318* (2013.01); *H05K 7/20327* (2013.01); *H05K 7/20936* (2013.01)

(58) Field of Classification Search
USPC ......................................................... 361/603
See application file for complete search history.

(56) References Cited

U.S. PATENT DOCUMENTS

| | | | | |
|---|---|---|---|---|
| 2,024,742 | A * | 12/1935 | Parsons | H01F 27/06 361/268 |
| 3,212,563 | A | 10/1965 | Schrader | |
| 3,377,487 | A * | 4/1968 | McNulty | H01R 13/53 307/17 |
| 5,220,484 | A * | 6/1993 | Seri | E04H 5/04 165/80.3 |
| 6,229,707 | B1 * | 5/2001 | Keenan | H02B 7/06 361/601 |
| 6,304,444 | B1 * | 10/2001 | Combs | H05K 7/2059 165/80.3 |
| 6,772,566 | B1 * | 8/2004 | Machledt | H02G 9/10 220/4.02 |
| 7,475,515 | B2 * | 1/2009 | Machledt | H02G 9/10 174/50 |
| 7,777,994 | B2 * | 8/2010 | Magnier | H01F 27/402 361/37 |
| 8,054,628 | B2 * | 11/2011 | Carsten | H02B 7/06 361/698 |
| 2012/0019111 | A1 | 1/2012 | Buescher et al. | |

FOREIGN PATENT DOCUMENTS

| | | | | |
|---|---|---|---|---|
| EP | 0499592 | A1 * | 8/1992 | .............. E04H 5/04 |
| EP | 1435681 | A1 | 7/2004 | |
| EP | 1970922 | A1 | 9/2008 | |
| EP | 1978614 | A1 | 10/2008 | |
| EP | 1764888 | B1 | 1/2014 | |
| ES | 2157770 | A1 | 8/2001 | |
| ES | 2229873 | A1 | 4/2005 | |
| ES | 2341602 | B1 | 6/2010 | |
| ES | 2456641 | T3 | 4/2014 | |
| KR | 101061859 | B1 | 9/2011 | |
| WO | 9823017 | A1 | 5/1998 | |
| WO | 2015053543 | A1 | 4/2015 | |

OTHER PUBLICATIONS

International Search Report of the International Searching Authority for Application No. PCT/ES2017/000003 issued the International Searching Authority, Madrid, Spain dated Apr. 21, 2017, 5 pages.
Witten Opinion of the International Searching Authority for Application No. PCT/ES2017/000003 issued by the International Searching Authority, OEPM, Madrid, Spain dated Apr. 21, 2017, completion date, Mar. 28, 2017, 5 pages.
International Preliminary Report of Patentability and International Preliminary Report on Patentability for Application No. PCT/ES2017/000003 issued by the International Bureau of WIPO, Geneva, Switzerland, p. 1, date of issuance Aug. 21, 2018 which includes the Written Opinion of the International Searching Authority for International Application No. PCT/ES2017/000003 dated Apr. 21, 2017 with a completion date of Mar. 28, 2017 issued by the OEPM, Madrid, Spain, 5 pages.
Translation of International Search Report of the International Searching Authority for Application No. PCT/ES2017/000003 issued by the International Searching Authority, OEPM, Madrid, Spain dated Apr. 21, 2017, 4 pages.
Translation of Written Opinion of the International Searching Authority for Application No. PCT/ES2017/000003 issued by the International Searching Authority, OEPM, Madrid, Spain dated Apr. 21, 2017, 6 pages.
Ormazabal, "MV/LV Substations for Distribution Network Solutions PFS Concrete enclosure for underground Transformer Substations" VELATIA, Oct. 26, 2014 [online] [retrieved on Mar. 27, 2017] Retrieved from the Internet <URL:http://web.archive.org/web/20141026223228/http:/www.ormazabal.com/site s/default/files/descargas/CA-405-EN-1307_0.pdf.

* cited by examiner

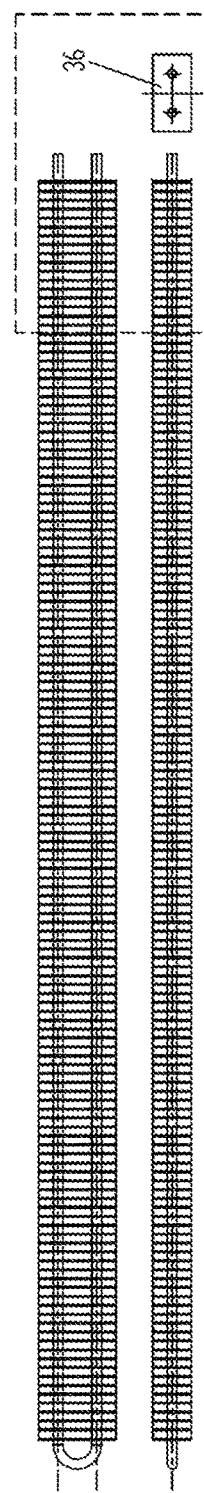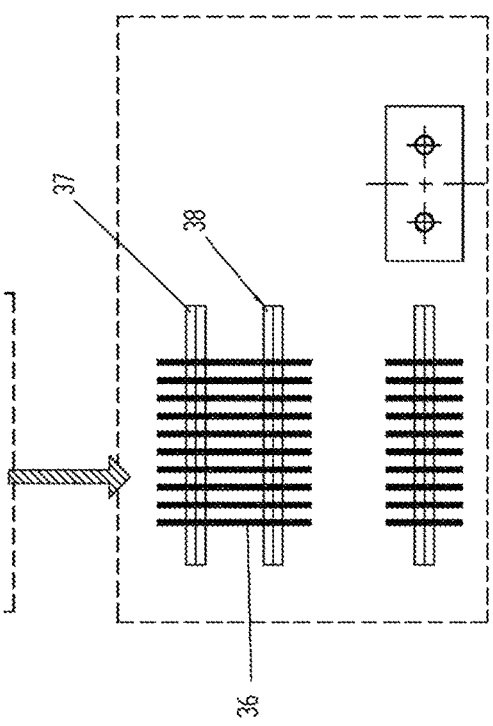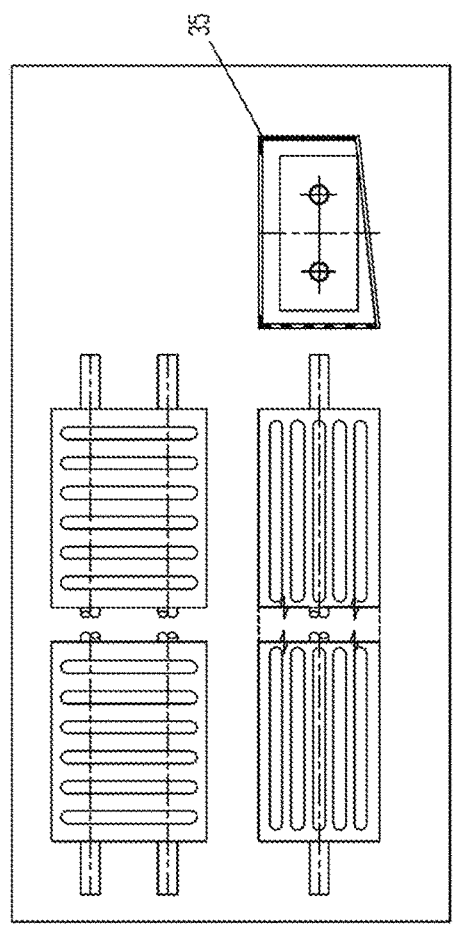
FIGURE 15
FIGURE 16
FIGURE 17

UNDERGROUND MODULAR TRANSFORMATION CENTRE THAT IS RESISTANT TO DISASTERS AND ADVERSE CONDITIONS

TECHNICAL FIELD

The present subject matter pertains to the field of industrial engineering, and more specifically, to the field of electrical energy distribution and transformation systems.

The present subject matter may further pertain to a new underground transformation centre capable of providing greater safety, improved operability, improved continuity of the energy supply in the case of disasters and facilitating the placement of these installations in the urban environment.

BACKGROUND

The design of distribution transformation centres has hardly varied over recent decades, where a transformer located inside a facility is still being used and the heat thereof is removed to the environment through ventilation grilles. These facilities are very susceptible to fires which, due to the volume of existing oil, can reach significant magnitudes. On the other hand, the electrical circuits thereof are very likely to collapse in the case of flooding.

The present subject matter aims, by dismissing the existing design criteria and in an objective way, to study a new model that provides greater safety and improved continuity of supply in the case of disasters (floods, fires, earthquakes, etc.). It must not be forgotten that in the case of an emergency of this type, ensuring the continued operation of the electricity distribution grid is fundamental to be able to power urgent and essential services, such as communications, health centres, pumping systems, etc.

It also must not be overlooked that it is very difficult to place new transformation centres in large cities, and even more so if electric vehicles are expected to become common for urban mobility; for this reason, it is important to adopt new designs that allow them to be present in areas where visual impact is important and where there is no unobstructed ground space to place traditional transformation centres.

Similar installations do exist, however, none of them are currently adapted for the use that is herein described. No observed underground transformation centre is modular, thereby enabling units to couple to each other in order to obtain the transformer power needed. Furthermore, no proposals for a cooling system including an external surface exchanger that replaces the current natural convection ventilation grilles have been observed. This cooling system, in addition to being easily integrated into the urban environment, will be able to have a centre configured to be open that is completely watertight and resistant to floods, heavy rain, tsunamis, etc. On the other hand, there is no example that uses an enclosing body resistant to adverse conditions. The use of a novel geometry will make it possible to better resist the mechanical stress of the ground, as well as incorporate the option of simple coupling of several modules, if necessary, in order to increase the power supplied in a specific area. The transformation centre system proposes a new design for the transformer for better fitting and watertightness of the installation, as well as for improvements in the use of the interior space. Thus, by having a completely watertight and pressurised transformation centre, a fire protection system can be provided at the site for complete flooding of this space by inert gas. This provides a high level of safety against the spread of fires and a high degree of protection to the equipment forming the transformation centre system.

SUMMARY

The transformation centre hereof may have a sole enclosing body, which contains all electrical switchgear, machines and other equipment. The installation will be underground, having an enclosing body, preferably metal and having a cylindrical shape, and two end units that close it at the sides thereof. These units are screwed by a coupling system, preferably ferrules or screws. All electrical components from high-voltage switchgear to low-voltage dashboards, including the transformer, control devices and interconnections between the different elements, are included inside the enclosing body.

The main advantage of these transformation centres is that most of the construction, assembly and equipment can be entirely factory-built, thus ensuring uniform quality and significantly reducing civil works and assembly at the point of installation.

This type is preferably chosen since it has two important advantages:
  a) The cylinder is a geometric figure that performs better towards the possible pressure of the ground to which it may be subjected.
  b) The constructive shape, by the bending of the panel, makes it so that it only has a weld bead in the generatrix of the cylinder (apart from those needed for the end caps). Thus, the possible corrosion points are reduced to a minimum.

The transformation centre is modular, which, if necessary, enables several modules to be coupled to each other until obtaining the transformer power needed. The end pieces of the side ends of these modules will be preferably convex without welding and they will join the central cylinder by a coupling system, preferably screwed ferrules with intermediate elastic seal.

The enclosing body of the transformation centre will have lifting hooks for the handling thereof so that the tank does not undergo stress that creates permanent deformations. A metal plate will also be provided under the centre to establish the connection thereof to the ground network. Furthermore, lower supports will be provided that will fasten to the reinforced concrete floor on which the transformation centre will rest.

A floor plate as technical flooring, preferably made of Tramex perforated grids of an insulating material is provided inside the transformation centre. This floor plate is supported on some supports welded to the sides of the wall. Thus, it forms a horizontal plane in such a way that there is a space available under it in order to accommodate the coolant of the transformer that may be spilled in the case of failure in the tank or in the cooling circuit.

The upper part of the centre has upper hollows. Some are manholes which are discussed below and others are larger holes that enable the switchgear to be inserted or removed (assembly hatch). These latter assembly hatches are hermetically sealed using the upper cover of the transformer by incorporating a watertight coupling system, preferably screwed perimeter ferrule.

The assembly hatch will be that which is used for inserting and removing all interior switchgear. It will be preferably rectangular and will have a watertight coupling system, preferably a screwed ferrule.

All access hatches, both manholes and switchgear and transformer hatches, must have a degree of protection that will provide them with complete high insulation against the penetration of dust and a degree of watertightness that enables the permanent existence of a layer of water on it.

A chamber joining the level of these hatches to the outside street level will be provided on each access hatch for personnel and the assembly hatch as described above. These chambers can be made of masonry or pre-cast material (plastic, concrete, etc.).

All hatches will have street-level resistant cast-iron covers for the intended external use.

In order for the personnel to access the inside, and since all operations are carried out from the outside and, therefore, said personnel only has to go down in the case of failure, a portable ladder will be used that will be placed by maintenance personnel or, if applicable, there will be a vertical fixed ladder.

To pass the electrical cables to the outside of the transformation centre, tubes for passing the electrical cables, threaded on each side, are provided such that the tubes can be equipped with stuffing boxes that prevent water from passing to the inside. The unused tubes will be sealed with threaded plugs. The low-voltage outputs will be made preferably through the upper part of the enclosing body and the high-voltage outputs preferably through the lower part.

The transformation centre will have interior lighting, autonomous modules of emergency lighting, signage and hazard warnings, portable extinguishers and a fire detection control system that will activate the complete flooding system. A small control and safety dashboard that will be installed integrated into the same low-voltage general dashboard will be provided for the electrical circuits of the transformation centre.

The transformer used is a standard transformer that has undergone a number of modifications to improve the thermal effect and the improved adaptability for the interconnection thereof, thereby facilitating the connection between the high or low-voltage switchgear and the transformer.

These Modifications are:

a) High-Voltage Connection.
   A cone in one of the sides for each phase, preferably made from epoxy resins and a threaded metal outlet, will be provided for high-voltage connection. This connection is similar to the one existing in the operation bays, and on which standardised, preferably angled, connectors for the supplied voltage will be screwed.

b) Low-Voltage Output.
   The low-voltage outputs will be provided on the side opposite the high-voltage outputs and will have insulated conduits ending in copper plates. These plates will be extended to directly connect to the busbar of the low-voltage dashboard, thereby avoiding the existence of interconnecting wiring.

c) Cooling.
   The ventilation fins for cooling and reducing the heat produced by the transformer will be removed. These ventilation fins will be replaced by the circulation of the coolant through a pump system to an exchanger located on the surface outside the transformation centre, which will be discussed later on.
   Internal collectors will be provided inside the tank for recirculating the coolant, preferably a lower collector in one side of the tank and another upper collector, which are diametrically opposite. These collectors will be channelled to the outside of the transformer on both sides of the tank. One of the ends will be plugged and the pumping circuit of the coolant will be placed between the others, and the unused outlets will be equipped with a plug. These internal collectors will have equidistant bores, such that the inner circulation is as laminar as possible.

d) Other Outlets.
   Casings for introducing temperature sensors which are screwed to the tank on one of the sides thereof will be provided. The signals of these sensors will be used to be able to know the operating status of the machine in the outer control unit.

e) Cover.
   The upper cover of the tank will be screwed to said tank by the closure system, preferably ferrule and external screws. This upper cover will have dimensions larger than those of the tank so that it in turn can be used as a cover for the assembly hatch of the transformation centre that is preferably located in the centre of the enclosing body of the transformation centre. The coupling of the aforementioned cover to the enclosing body structure will be preferably carried out by through screws that will join said cover to a perimeter ferrule existing in the upper part of the enclosing body that forms the transformation centre. The joints will be equipped with elastic seals for the complete watertightness thereof.
   The dimensions of this cover will be the same for all transformers, regardless of the power thereof, such that given any possible need to expand power in an area, the transformer can be easily changed. It would only be necessary to remove the previous transformer and place the new one, preceding the assembly and reconnecting the high-voltage and low-voltage supply and cooling circuit.

As mentioned above, the removal of heat generated inside the transformer is carried out by an exchanger located on the surface.

The exchanger may include an assembly of horizontal tubes with heat sinks made of perpendicular panels welded thereto. The entire assembly is preferably provided inside a housing equipped with grilles for the correct intake and outlet of air and to promote the correct exchange of heat by convection.

This housing is preferably designed in a such way that it can be embedded into the curb of a sidewalk, replacing part of this curb, thus ensuring that this element does not have a visual impact on the assembly once installed.

The exchanger will be equipped with two throttle shut-off valves so that, in the case of repair or replacement, the entire circuit does not need to be drained. Likewise, it will have an outlet to replace the coolant in the case of loss.

A fire protection system for complete flooding of the site by inert gas will be provided. The system will be triggered by the activation of fire detectors and the electronic control switchboard. The gas bottles are attached to one of the ends of the cylinder.

Operation And Control

Completely autonomous operation of the assembly and operation of the switchgear by remote actuation is provided; in other words, the connection or disconnection of the high and low-voltage circuit breakers will be carried out from the external switchboard or even from a switchboard located in a different area, by adopting the encoding of network remote management that each electricity supply company has. The high-voltage switchgear will be made up of motorised circuit breakers and the transformer protection bay will have thermal and magnetic protection relays for disconnection in the case of machine overload.

The low-voltage output dashboard will be equipped with automatic circuit breakers with motorised connection and disconnection.

All operations of the high and low-voltage switchgear will be carried out from a switchboard located on the surface outside. Likewise, the signals of the temperature sensors of the machine, the state of triggering the fire prevention system and other signals that are of interest for the exploitation of the centre (internal ambient temperature, existence of discharge at the bottom of the tank, etc.) are channelled in this switchboard.

An electronic closure system will be provided to prevent the access of unauthorised personnel, it being necessary to enter a key in the switchboard to open the system.

Likewise, the switchboard will enable the record of operations carried out and accesses permitted to be stored.

The switchboard can be actuated directly from the location thereof or remotely, enabling this system to be incorporated into another system with intelligent, comprehensive management or Smart Grids.

This switchboard will be provided on the outside with direct access to a public street and installed inside a watertight box.

Alternative Cooling System

In the aforementioned developments, the forced circulation of the coolant existing in the tank of the transformer with cooling by an external exchanger located on the surface is proposed. However, with a new variant as described here, it is proposed that the outer exchanger be removed and be replaced by the use of a cooling cycle to keep the machine at subcooled temperatures in order to obtain important increases in the performance and greater load capacity in the transformer.

The application of a load greater than that of the plate with characteristics and/or ambient temperature greater than the design temperature implies a degree of risk and accelerated ageing of the transformers. Another constraint on these machines is the fact that by being subjected to high temperatures, the load factor thereof significantly decreases, thereby losing part of the capacity thereof.

To avoid these problems, and taking into account that it has been studied that important increases in the performance of the machine are obtained by subcooling the coolant of the transformer, an alternative cooling system is proposed for these systems, such that low enough temperatures are obtained in the inside thereof in order to achieve the desired effect.

The system may include not only removing the generated heat to the outside, but also obtaining subcooling of the machine that will promote obtaining important improvements in the performance thereof. Thus, in places where there is a lack of installed power or areas where the outer ambient temperature makes the transfer of heat by natural convection difficult, this other proposed system can be adopted.

A closed cooling cycle system formed by a condensing unit external to the site of the transformation centre is provided. This unit can be any model existing on the market, having the cooling capacity needed. This cooling cycle will use some of the usual commercial gases.

A new evaporator design made up of a ring, preferably made of steel, is provided with the same inner dimensions as the tank of the transformer and with a perimeter coupling system, preferably a screwed ferrule. The lower part of this ring will join the upper part of the tank of the transformer, and the upper part will fit into the cover thereof, the inner coupling of this cover being used. Indeed, it involves nothing more than placing this evaporator between the transformer and the upper cover thereof.

A network of horizontal tubes with heat dissipative panels are placed inside the aforementioned ring. The ends are extended to the outside of the ring, the seals being sealed by soft welding, and they are connected to the external condensing unit, using the through tubes with stuffing boxes existing in the centre, thus forming a closed cycle.

The joints between the elements will be equipped with elastic seals for making the assembly watertight. The inside of the ring and the tank will be filled with the same coolant, such that the evaporator coil is perfectly submerged.

The outer walls of the transformer-evaporator assembly will be equipped with high-density thermal insulation by industrial adhesive that prevents undesirable gains of heat and condensation outside the tank.

The system will be actuated by a thermostat placed in the upper area of the tank of the transformer by one of the existing threaded casings.

BRIEF DESCRIPTION OF THE DRAWINGS

As a complement to the description provided herein, and for the purpose of helping to make the characteristics of the developments hereof more readily understandable, a set of drawings is attached as an integral part of said description, which, by way of illustration and not limitation represents the following:

FIG. 9 shows an initial standard transformer.

FIG. 10 shows the removal of the ventilation fins (23) and of the transport wheels.

FIG. 11 shows that the transformer is turned over, as well as the incorporation of the upper closing cover of the assembly hatch (2) and rotation of the high and low-voltage terminals.

FIG. 12 shows the incorporation of internal collector tubes (25) and the threaded casings, and a metal box is attached to the tank to accommodate the terminals (26) (27).

FIGS. 15, 16 and 17 show the heat exchanger of the transformation centre system.

FIG. 15 shows a plan, elevation and profile view of the heat exchanger.

FIG. 16 shows a detailed view of the exchanger, wherein it can be easily seen that it is made up of fins (36) and horizontal tubes (37) (38).

FIG. 17 shows an elevation, plan and profile view of a possible external shape of the housing (35) that accommodates the exchanger on the inside. This figure also shows the arrangement of the possible grilles in the front upper part thereof.

DETAILED DESCRIPTION

As mentioned above, the purpose of the described subject matter is to provide greater safety (the operator will not be required to go down to the transformation centre to check the status or to operate the equipment, and furthermore, there is an effective fire protection system), improved operability of the system (due to the fact that any action can be carried out remotely and in a programmed way), improved continuity of the energy supply in the case of disasters (this system is able to withstand floods, tsunamis, earthquakes, etc.), and facilitating the placement of these installations in the urban environment (since it is an underground centre, the problem of occupying urban space does not exist, and furthermore, it does not require ventilation stacks or grilles, thus easily blending in with the environment and being able to be installed both under the sidewalk and under the street).

A particular example of an underground transformation centre system according to the present subject matter and referring to the attached figures is described below.

Figure 1:
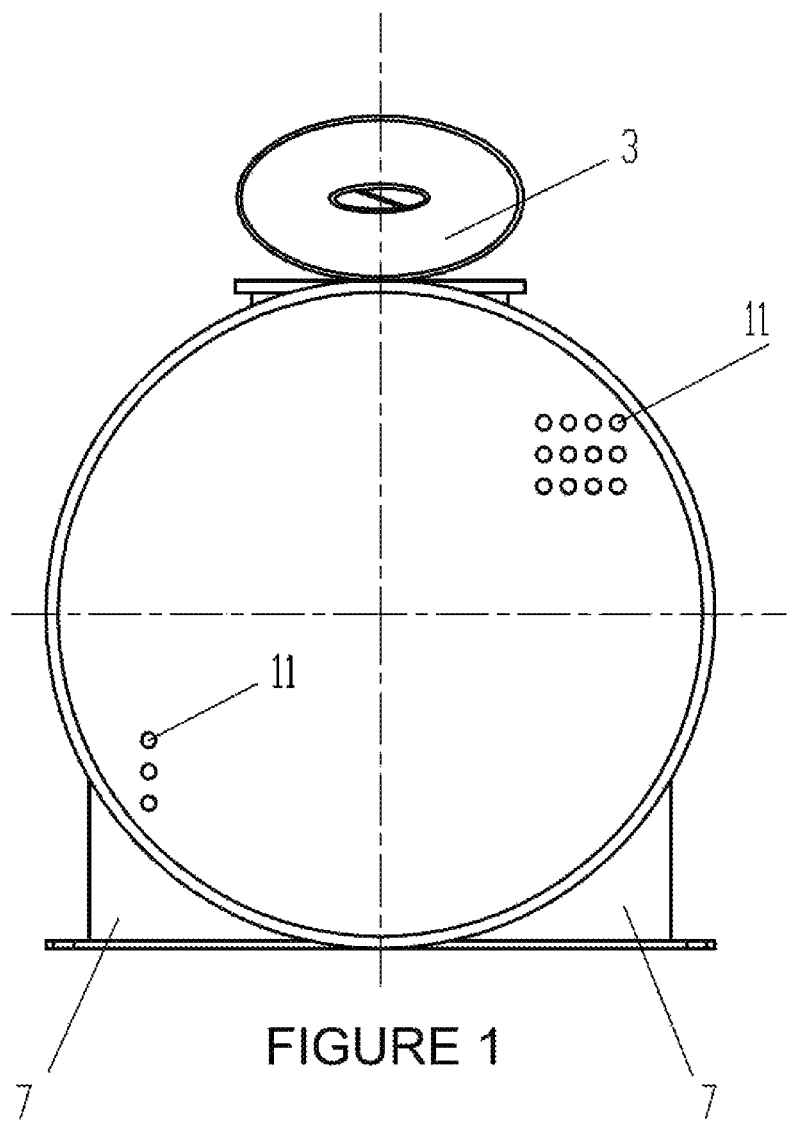
FIG. 1 shows the profile of the enclosing body of the transformation centre (10), being able to observe the hatches corresponding to the manholes (3), the tubes for the electrical cables (11) and the lower support of the centre (7).
Figure 2:
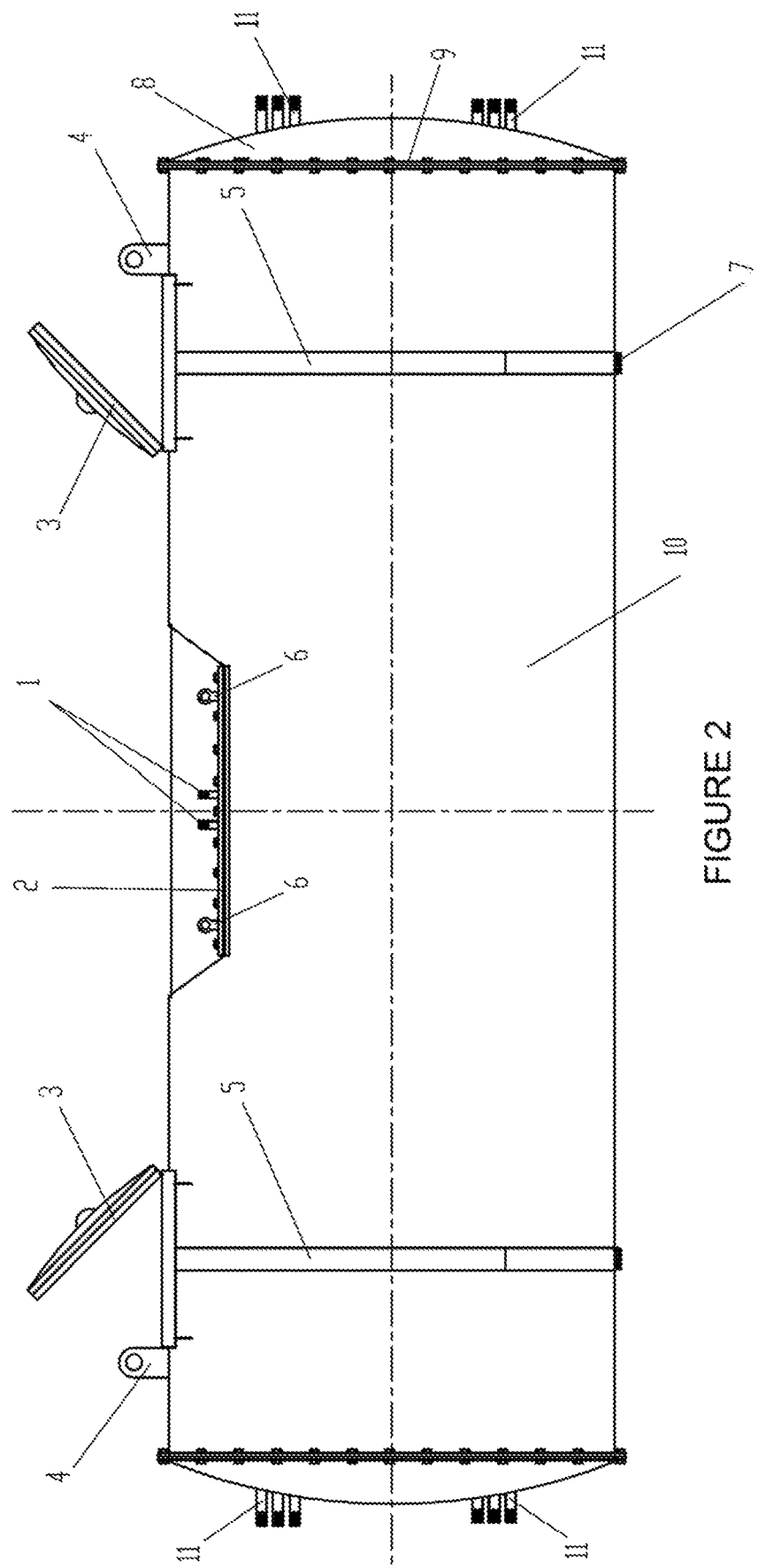
FIG. 2 shows the elevation view of the enclosing body of the transformation centre (10), being able to observe the assembly hatch (2) as well as the manholes hatches (3).
Figure 3:
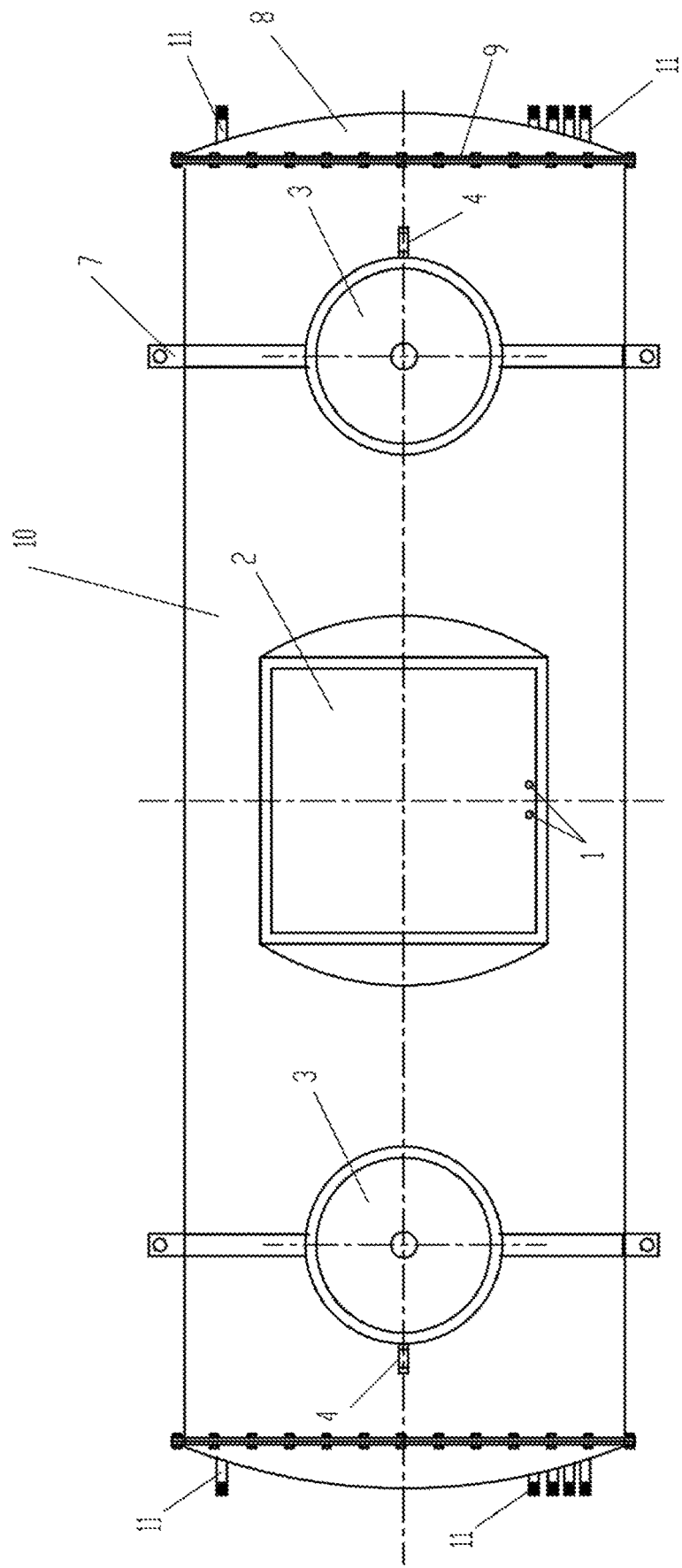
FIG. 3 shows a plan view of the enclosing body of the transformation centre (10), where the assembly hatch (2) and the manholes hatches (3) can be observed.
Figure 14:
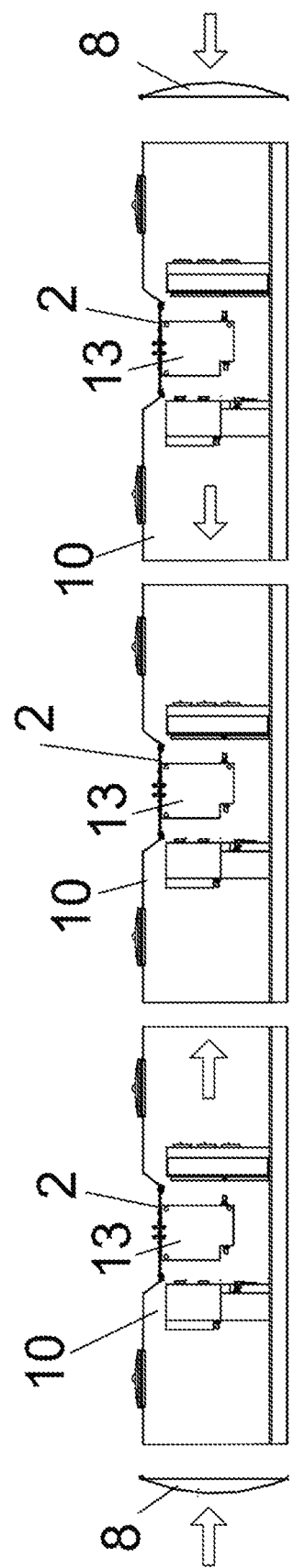
FIG. 14 shows the option of coupling several transformation centre units to each other in a simple way, thereby being able to easily increase the power provided by the installation, if necessary.
Figure 18:
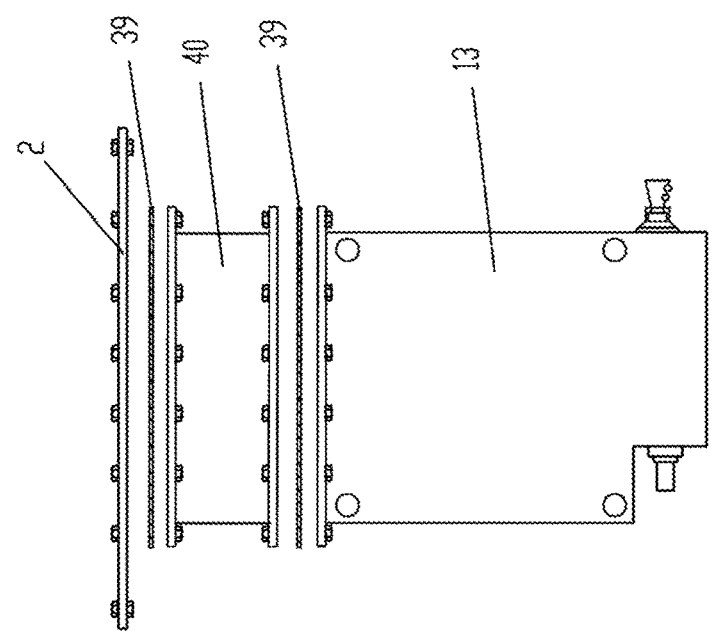
FIG. 18 shows how the evaporator (40) is placed between the tank of the transformer (13) and the cover of the assembly hatch (2). The joints have elastic seals (39) to make them watertight.
Figure 19:
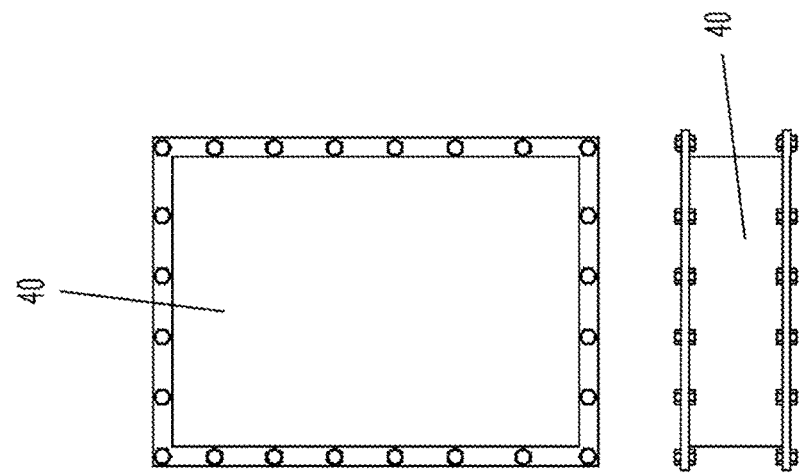
FIG. 19 shows an outer appearance of the evaporator (40).
Figure 20:
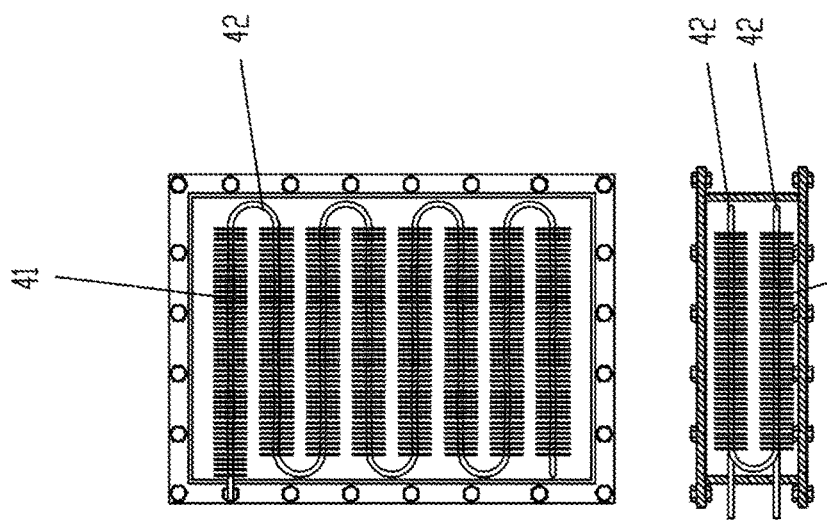
FIG. 20 shows an inner cross section of the evaporator which shows the network of tubes (42) and the heat sinks (41).

FIGS. 1, 2 and 3 describe the outer appearance of the transformation centre. The transformation centre has a cylindrical metal enclosing body (10) and two end units that close it at the sides (8) thereof which are screwed by flange joints (9). Thus, if necessary, several modules can be coupled to each other until obtaining the transformer power needed (see FIG. 14). The enclosing body will have lifting hooks (4) for the handling thereof. Furthermore, it will have lower supports (7) that will fasten to the reinforced concrete floor on which the transformation centre will rest.

Three upper hollows will be provided. Two of these hollows are manhole hatches (3), and the third is an assembly hatch (2) that enables the inner switchgear to be inserted or removed. This assembly hatch (2) is hermetically sealed using the upper cover of the transformer by having a screwed perimeter ferrule.

A sufficient number of reinforcement rings (5) are provided to give strength to the enclosing body. To pass the electrical conductors to the outside, tubes (11) for passing electrical cables, threaded on each side, are provided, such that the tubes can be equipped with stuffing boxes that prevent water from passing to the inside.

Figure 4:
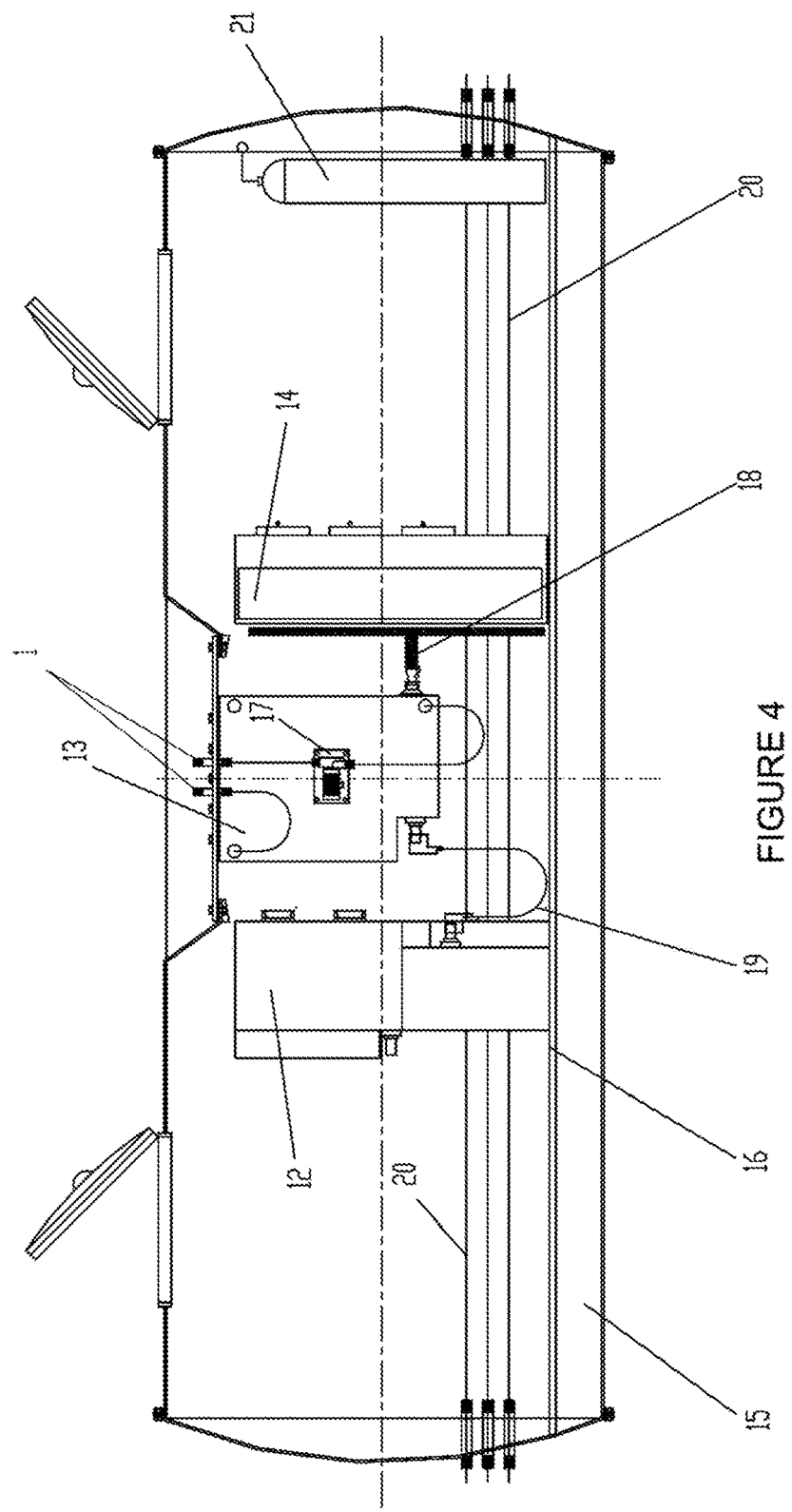
FIG. 4 shows a longitudinal cross section of the assembly, where the internal arrangement of the high-voltage equipment (12), the fit of the new transformer (13) and the low-voltage equipment (14), as well as the respective interconnections thereof (18) (19) can be seen.
Figure 4:
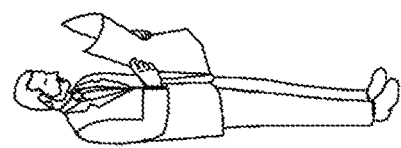
Figure 5:
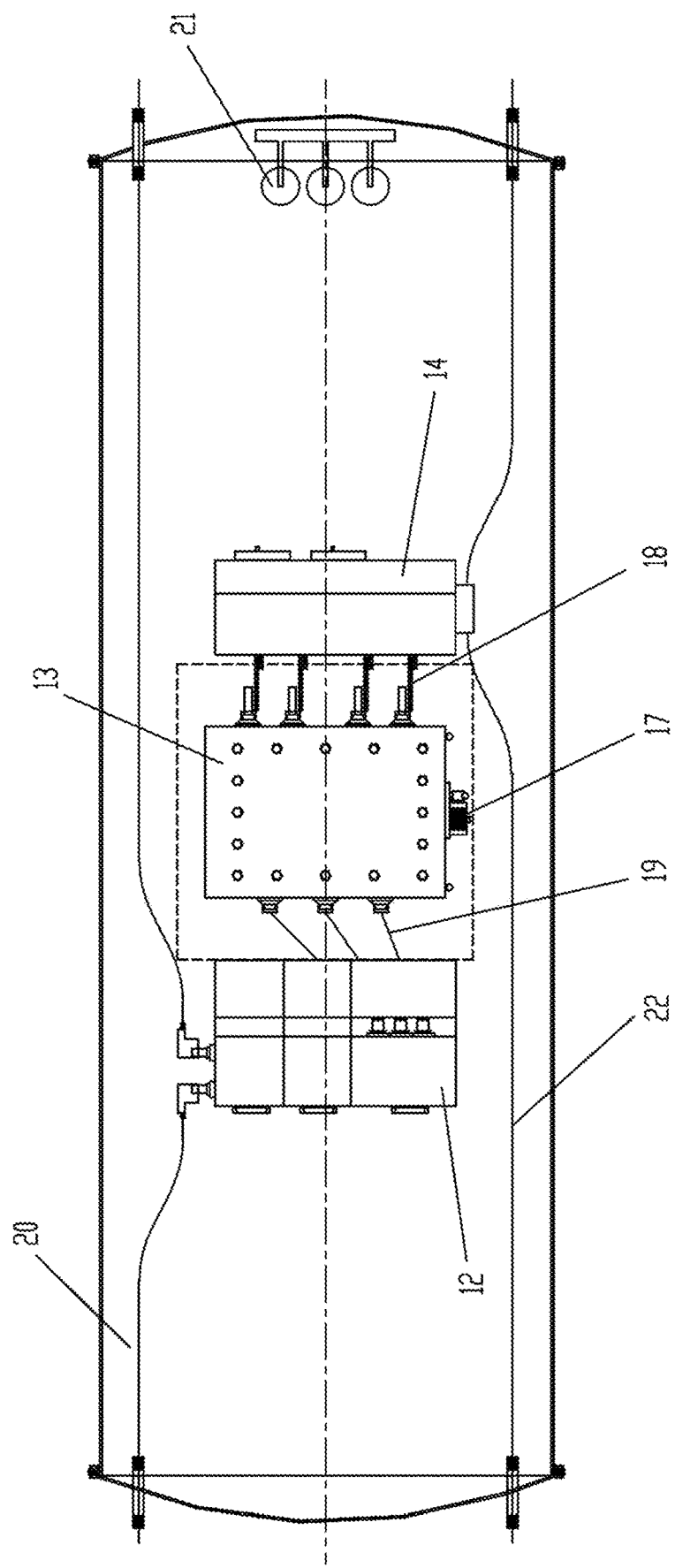
FIG. 5 shows a plan view of the arrangement of the equipment inside the transformation centre.
Figure 8:
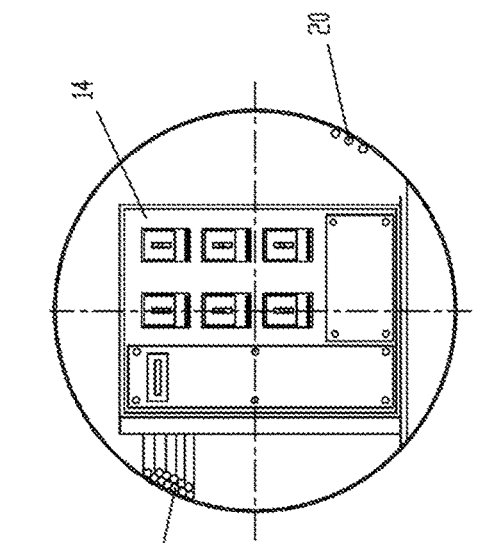
FIG. 8 shows a transverse cross section of the transformation centre through the low-voltage area.
Figure 7:
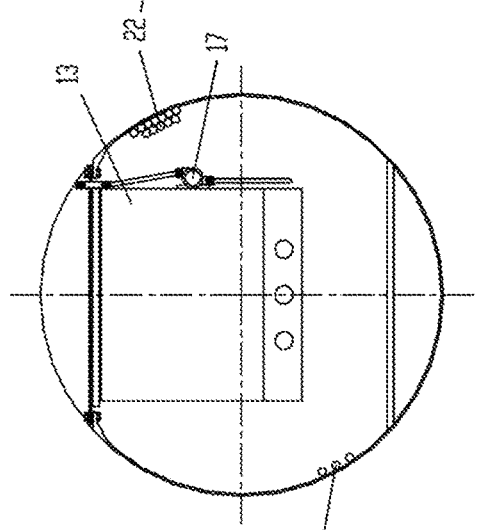
FIG. 7 shows a transverse cross section of the transformation centre through the area of the transformer.
Figure 6:
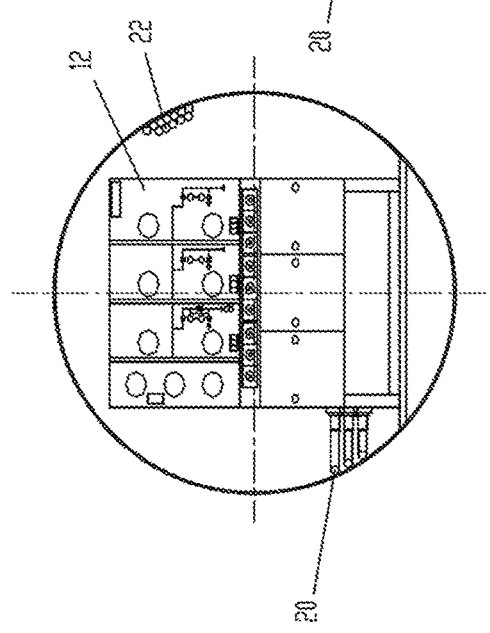
FIG. 6 shows a transverse cross section of the transformation centre through the high-voltage area.

Distribution of the different equipment is provided according to FIG. 4 and FIG. 5, which enables all high-voltage switchgear (12), the transformer machine (13) and the low-voltage general dashboard (14) to be installed inside the transformation centre. These views show how the interconnection between each of these elements is carried out. These two figures also show the linking conductors between bays and transformer (19) and the connection of the outputs thereof with the general low-voltage busbar by copper plates (18).

These figures also show the arrangement of the coolant pump of the transformer (17), which will push this fluid from the transformer to the outer exchanger through tubes (1) passing from the outside to the inside made in the cover of the transformer.

The inside of the centre is provided with a floor plate (16) as technical flooring, made of Tramex perforated grids of an insulating material. This floor plate is supported on some supports welded to the sides of the wall. Thus, it forms a horizontal plane in such a way that there is a space available (15) under it to accommodate the coolant of the transformer that may be spilled in the case of failure in the tank or in the cooling circuit.

The interconnection lines between the outside and the transformation centre, both lines of high-voltage supply (20) and lines of low-voltage output (22), will run through the inside of the centre, attached to the sides thereof, and fastened to the inner wall by clamps or flanges.

A fire protection system for complete flooding of the site by inert gas will be provided. The gas bottles (21) are attached to one of the ends of the cylinder.

Figure 9:
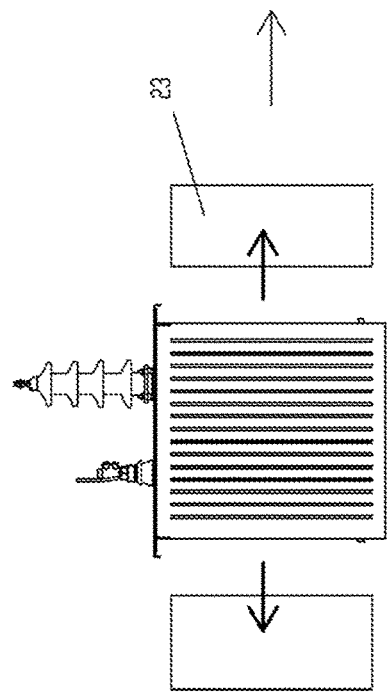
FIGS. 9, 10, 11 and 12 show a detailed view of the transfer process from a conventional transformer to the proposed transformer.
Figure 10:
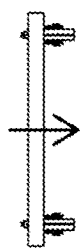
Figure 10:
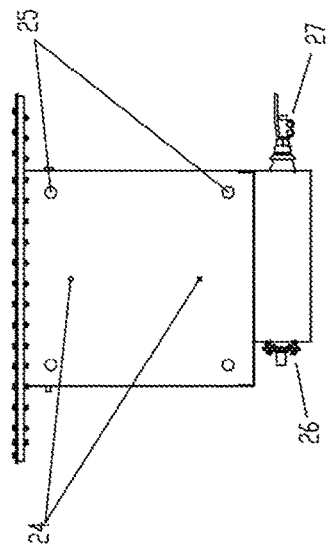
Figure 11:
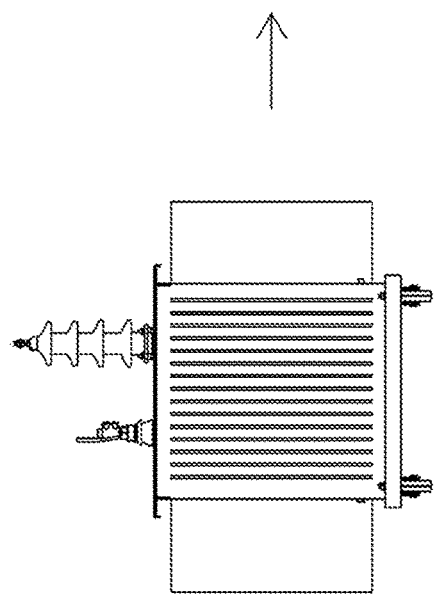
Figure 12:
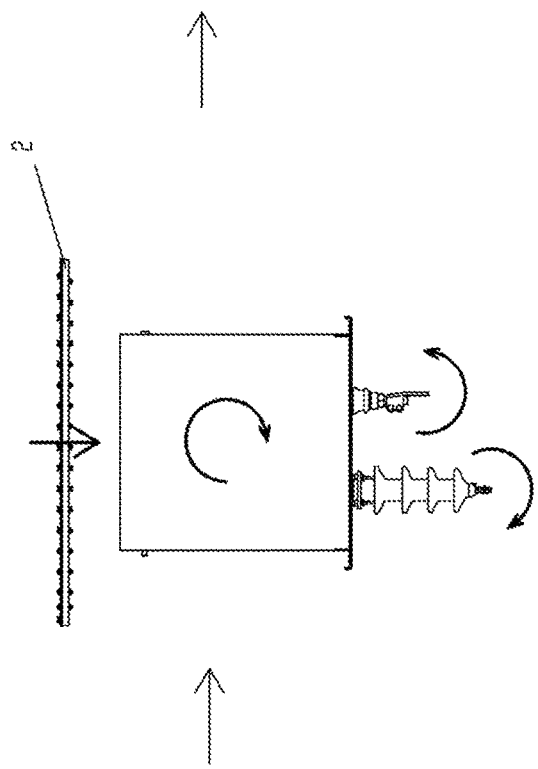

The transformer used in the transformation centre is the standard model (FIG. 9) to which a number of modifications have been made. These modifications do not affect the arrangement of the coils inside of it or the dimensions of the tank. The modifications carried out to obtain the new transformer model are described as follows:

a) The entire inner support system and transport wheels are removed. (see FIG. 10).
b) All cooling fins (23) are removed. (see FIG. 10).
c) The upper cover is replaced by the cover of an assembly hatch (2), and the high and low-voltage vertical outputs are replaced by horizontal outputs (see FIG. 11); to facilitate these outputs, the tank is expanded and high-voltage connection cones (26) and low-voltage output plates (27) are provided on them. (see FIG. 12).
d) The entire assembly is rotated 180°, such that these outlets are in the lower part thereof.
e) Two internal collector tubes are provided for circulating the coolant. These tubes are provided in diametrically opposing points of the tank. Equidistant bores will be provided inside of it to promote perfect internal circulation of the liquid. Each end is extended to the outside of the tank (25) and is equipped with threading (two of the outputs are used for interconnecting the circuit and the other two are equipped with threaded plugs).

f) Threaded casings (24) will be provided in the tank to accommodate the temperature detectors.

g) The cover of the assembly hatch (2) will be screwed to the transformer by threaded screws and an elastic seal. The dimensions of this cover increases in such a way that it can in turn be used as a cover for the manhole; for this reason, it will have another number of holes for the perfect joining thereof to the ferrule that is provided on the enclosing body of the transformation centre. The assembly ends with the incorporation of welded tubes (1) passing from the outside to the inside, where it will connect the external exchanger and the eyebolts for the assembly (6) thereof.

According to FIG. 15, the external exchanger is formed by two horizontal tubes (37) (38) joined at the end thereof to form a closed circuit. Heat sinks (36) parallel to the generatrix of the tubes are provided, clamping the two tubes and being welded to them. See FIG. 16 to have a better view of the appearance of these dissipative panels. The external exchanger is complemented with an outer housing (35) (see FIG. 17) that will be equipped with ventilation grilles on the front and upper faces thereof; the air enters through the first and exits through the second, heat being transferred by convection from the dissipative grilles to the environment. Emphasis is placed on the fact that in the case of flooding, this system continues to operate since the heat would be transferred from the plates to the surrounding water.

Figure 13:
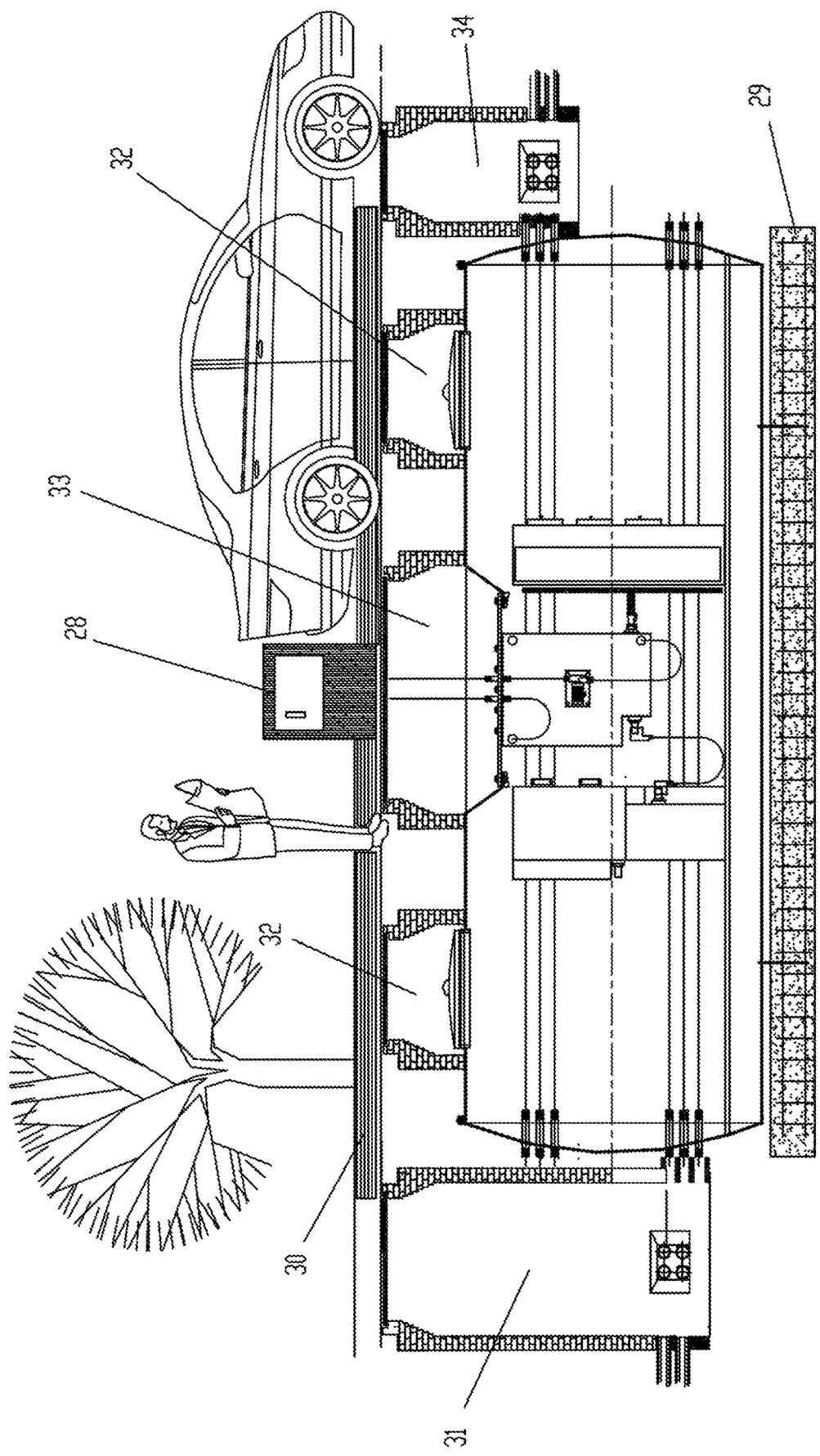
FIG. 13 shows the side profile of the underground modular transformation centre system in full operation. Here it shows the arrangement of the different chambers (31) (32) (33) (34) needed, the control and operations switchboard (28), the exchanger embedded in the curb of the sidewalk (30) and the concrete slab needed to ensure the stability of the assembly (29). With this figure, it is easy to get an idea of the dimensions of each element and of the final result thereof once placed in the urban environment.

The entire system forms a longitudinal exchanger that can be easily installed in the urban environment, replacing part of the curb of the sidewalk, or in any other similar arrangement that blends in with the environment. (See FIG. 13).

The control panel (28) may include a steel enclosing body equipped with a watertight and submersible cover. The tubes passing from the outside to the inside will have equally watertight and submersible stuffing boxes. The control panel will be provided close to the transformation centre and will blend in with the environment. The cover will have a closure standardised by the supply company. A switchboard with a man-machine touchscreen of a model existing on the market and which will be accepted by the supply company will be provided on the inside.

With regards to the alternative cooling system by sub-cooling of the machine, we can observe FIG. 16 which shows how the evaporator (40) is placed between the tank of the transformer (13) and the cover of the assembly hatch (2). As can be seen, the transformer used for this system is the modified transformer (13) explained above.

The evaporator systems include a metal ring whose inner dimensions coincide with those of the inside of the tank of the transformer. In the upper and lower perimeter thereof, there is a closure system, in this case, screwed ferrule, whose nominal diameter, placement and spacing coincide with those of the cover of the transformer for the perfect coupling thereof to this transformer and to the cover of the assembly hatch that closes it.

A network of horizontal tubes (42) with heat dissipative panels (41) are placed inside the aforementioned ring. The ends are extended to the outside of the ring, the seals being sealed by soft welding, and they are connected to the external condensing unit, using the tubes passing from the outside to the inside with stuffing boxes (1) existing in the centre, thus forming a closed cycle.

The joints between the elements will be equipped with elastic seals (39) for making the assembly watertight. The inside of the ring and the tank will be filled with the same coolant, such that the evaporator coil is perfectly submerged.

The outer walls of the transformer-evaporator assembly will be equipped with high-density thermal insulation which will stick, by industrial adhesive, to the outer panel of these elements, such that it prevents undesirable gains of heat and condensation outside the tank.

The invention claimed is:

1. An underground modular transformation centre system that is resistant to disasters and adverse conditions, the transformation system comprising:
   a transformation centre comprising:
      a disaster and adverse condition resistant enclosing body having two ends, a coupling system arranged in each of said two ends and closing covers joined to the coupling system;
      an assembly hatch with an upper watertight access cover of the assembly hatch for inserting a switchgear and a manhole hatch with an upper watertight access cover of the manhole hatch for the access by people;
      high-voltage protection and operating elements, a power transformer and low-voltage protection and operating elements inside of the transformation centre;
      tubes passing from the outside to the inside for placing electrical conductors having elements that provide watertightness to said electrical conductors and tubes for circulating a coolant;
      the transformation centre being modular and configured to be longitudinally connected to other transformation centres through the coupling system arranged in the ends of the enclosing body; and
   a longitudinal heat exchanger arranged outside the transformation centre with a dimension similar to the length to this transformation centre, formed by horizontal tubes and heat dissipative sheets.

2. The transformation centre system according to claim 1, the power transformer being without fins.

3. The transformation centre system according to claim 2, the power transformer comprising a tank, the tank comprising a lower side area and electrical connection outlets arranged in the lower side area of the tank.

4. The transformation centre system according to claim 3, the tank of the power transformer comprising tubes having bores positioned in diametrically opposing points inside the tank, and having external threads protruding from the tank.

5. The transformation centre system according to claim 4, the tank further comprising threaded casings arranged on a side of the tank in order to attach temperature detectors to the tank.

6. The transformation centre system according to claim 3, the power transformer comprising an upper closing cover having an inner and an outer coupling system; the tank of the power transformer being coupled to the inner coupling system, and the outer coupling system being configured to fasten the power transformer to the enclosing body of the transformation centre.

7. The transformation centre system according to claim 6, the upper closing cover of the power transformer being the assembly hatch.

8. The transformation centre system according to claim 6, the inner and outer coupling system comprising watertight elastic elements.

9. The transformation centre system according to claim 4, further comprising:
- a closed fluid circuit from the tank of the power transformer to the heat exchanger arranged outside the transformation centre through the tubes of the tank; and
- a pump configured for circulating a coolant along the closed fluid circuit.

10. The transformation centre system according to claim 1, comprising motorised circuit breakers as high-voltage and low-voltage operating elements by an external surface switchboard, the circuit breakers being configured to be telematically connected to a central unit.

11. The transformation centre system according to claim 10, the circuit breakers comprising devices for disconnecting due to overload and short circuits.

12. The transformation centre system according to claim 10, comprising a surface switchboard installed inside a watertight box with a lock.

13. The transformation centre system according to claim 1, having a fire protection system for complete flooding of the transformation centre with inert gas.

* * * * *